United States Patent
Vanaparthy et al.

(10) Patent No.: US 11,159,175 B2
(45) Date of Patent: Oct. 26, 2021

(54) NON-UNIFORM ITERATION-DEPENDENT MIN-SUM SCALING FACTORS FOR IMPROVED PERFORMANCE OF SPATIALLY-COUPLED LDPC CODES

(71) Applicant: Intel Corporation, Santa Clara, CA (US)

(72) Inventors: Santhosh K. Vanaparthy, Santa Clara, CA (US); Ravi H. Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/448,935

(22) Filed: Jun. 21, 2019

(65) Prior Publication Data
US 2019/0312594 A1    Oct. 10, 2019

(51) Int. Cl.
*H03M 13/00* (2006.01)
*H03M 13/11* (2006.01)
*G11C 29/52* (2006.01)
*G06F 11/10* (2006.01)

(52) U.S. Cl.
CPC ..... *H03M 13/1111* (2013.01); *G06F 11/1068* (2013.01); *G11C 29/52* (2013.01); *H03M 13/6502* (2013.01)

(58) Field of Classification Search
None
See application file for complete search history.

(56) References Cited

U.S. PATENT DOCUMENTS

| | | | | |
|---|---|---|---|---|
| 8,281,210 B1* | 10/2012 | Farjadrad | ........ | H03M 13/6583 714/755 |
| 8,683,299 B2* | 3/2014 | Gunnam | ........ | H03M 13/3707 714/774 |
| 9,946,598 B1 | 4/2018 | Motwani et al. | | |
| 2006/0242536 A1* | 10/2006 | Yokokawa | ........ | H03M 13/6577 714/758 |
| 2009/0304111 A1* | 12/2009 | Shinya | ........ | H04L 1/0052 375/316 |
| 2014/0082449 A1* | 3/2014 | Zhang | ........ | H03M 13/112 714/752 |
| 2014/0173385 A1* | 6/2014 | Li | ........ | H03M 13/6331 714/780 |
| 2015/0135031 A1* | 5/2015 | Cohen | ........ | G11C 29/52 714/758 |
| 2015/0214980 A1* | 7/2015 | Xia | ........ | H03M 13/116 714/752 |
| 2015/0349807 A1* | 12/2015 | Vernon | ........ | H03M 13/6577 714/774 |

(Continued)

OTHER PUBLICATIONS

J. Heo, "Analysis of scaling soft information on low density parity check code," Electronics Letters, Jan. 23, 2003, pp. 219-221, vol. 39: No. 2, IET.

(Continued)

*Primary Examiner* — Mujtaba M Chaudry
(74) *Attorney, Agent, or Firm* — Jordan IP Law, LLC

(57) ABSTRACT

Systems, apparatuses and methods may provide for technology to receive a codeword containing an SC-LDPC code and conduct a min-sum decode of the SC-LDPC code based on a plurality of scaling factors. In an embodiment, the scaling factors are non-uniform across check nodes and multiple iterations of the min-sum decode.

17 Claims, 5 Drawing Sheets

(56) References Cited

U.S. PATENT DOCUMENTS

| | | | |
|---|---|---|---|
| 2016/0092300 A1* | 3/2016 | Lei | G11C 29/52 |
| | | | 714/764 |
| 2016/0164538 A1* | 6/2016 | Abu-Surra | H03M 13/1154 |
| | | | 714/776 |
| 2016/0294415 A1* | 10/2016 | Sugihara | H03M 13/3977 |
| 2018/0167086 A1* | 6/2018 | Tai | H03M 13/3753 |
| 2019/0114224 A1 | 4/2019 | Motwani et al. | |
| 2019/0273511 A1* | 9/2019 | Usatyuk | H03M 13/116 |
| 2019/0326931 A1* | 10/2019 | Liu | H03M 13/1122 |

OTHER PUBLICATIONS

Y. Jung et al., "New Min-sum LDPC Decoding Algorithm Using SNR-Considered Adaptive Scaling Factors," ETRI Journal, Aug. 1, 2014, pp. 591-598, vol. 36: No. 4, South Korea.

S. Kudekar et al., "Spatially Coupled Ensembles Universally Achieve Capacity Under Belief Propagation," IEEE Transactions on Information Theory, Dec. 2013, pp. 7761-7813, vol. 59: No. 12, IEEE.

S. Kumar et al., "Threshold Saturation for Spatially Coupled LDPC and LDGM Codes on BMS Channels," IEEE Transactions on Information Theory, Dec. 2014, pp. 7389-7415, vol. 60: No. 12, IEEE.

M. Lentmaier et al., "Iterative Decoding Threshold Analysis for LDPC Convolutional Codes," IEEE Transactions on Information Theory, Oct. 2010, pp. 5274-5289, vol. 56; No. 10, IEEE.

Wikipedia, "Low-Density Parity-Check Code," <wikipedia.org/wiki/low-density_parity-check_code#Updating_node_information>, retrieved Jun. 12, 2019, 8 pages.

\* cited by examiner

NON-UNIFORM ITERATION-DEPENDENT MIN-SUM SCALING FACTORS FOR IMPROVED PERFORMANCE OF SPATIALLY-COUPLED LDPC CODES

TECHNICAL FIELD

Embodiments generally relate to memory structures. More particularly, embodiments relate to non-uniform iteration-dependent min-sum scaling factors for improved performance of spatially-coupled low-density parity-check codes during memory transactions.

BACKGROUND

During operation, non-volatile memory (NVM) such as NAND flash memory may encounter errors (e.g., read, write and/or erase errors) due to random noise, cell-to-cell interference, and so forth. While error correction code (ECC) techniques such as low-density parity-check (LDPC) codes may be used to correct such errors, there remains considerable room for improvement. For example, conventional ECC decoding solutions may experience a degraded raw bit error rate (RBER), result in reduced memory capacity and have relatively high hardware complexity (e.g., increased cost).

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Future NAND flash memory structures are expected to have large indirection (e.g., dereferencing) lengths of, for example, 16 KB, 32 KB and 64 KB. This trend may provide an opportunity to use ECCs for large block lengths with a significant RBER gain. Current ECC designs for 4 KB block lengths are based on LDPC codes. Designing LDPC codes for large indirection lengths has a number of disadvantages. For example, the hardware complexity typically scales almost linearly as the block length is increased. Thus, compared to a 4 KB code, a 16 KB code may call for a 6× higher gate count and a 64 KB code may call for a 16× higher gate count. Additionally, the RBER improvement in the LDPC codes may experience diminishing returns with increasing block length. For example, for the same degree distribution, increasing the block length from 16 KB to 32 KB, there may be only a 5% RBER improvement at an UBER (uncorrectable bit error rate) of 1E-11.

Figure 1:
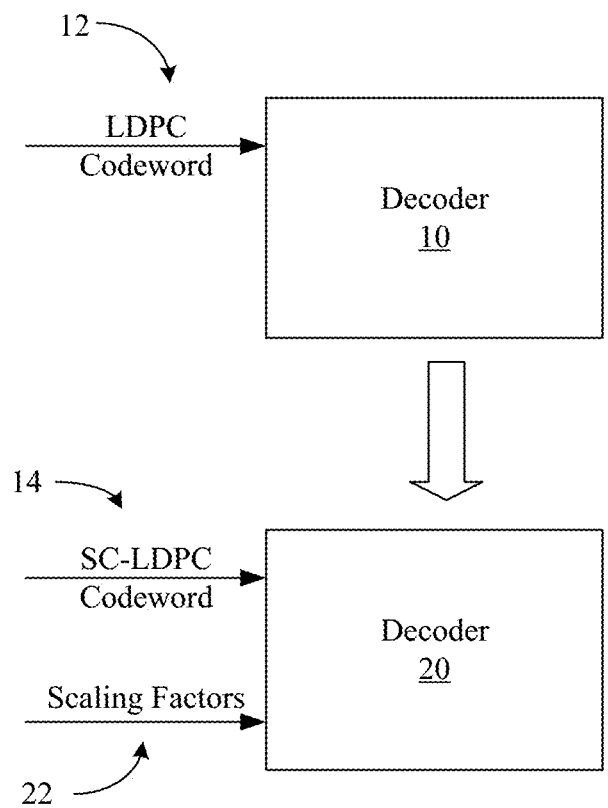
FIG. 1 is a block diagram of an example of a comparison between a conventional decoder and a decoder according to an embodiment.
Figure 2:
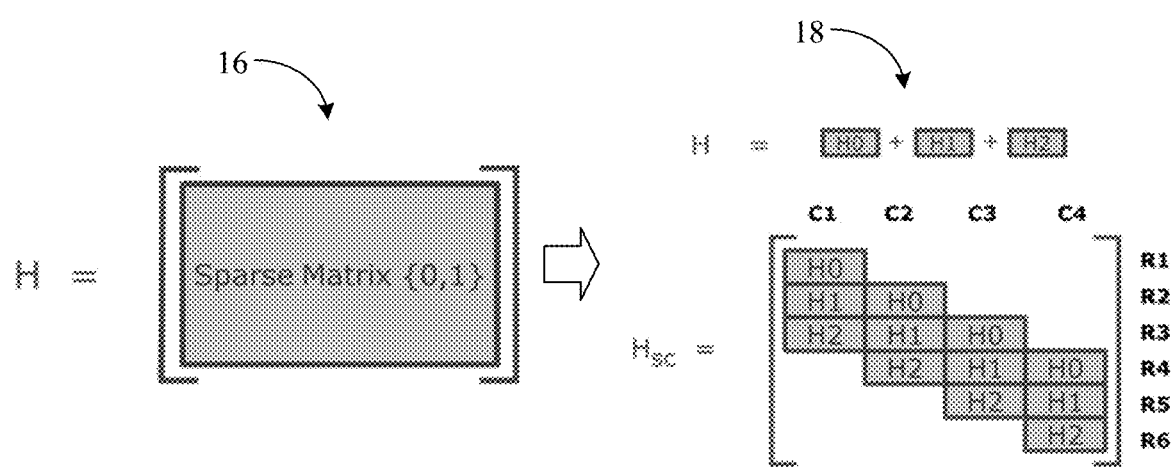
FIG. 2 is an illustration of an example of a comparison between a conventional parity-check matrix and a parity-check matrix according to an embodiment.

Turning now to FIGS. 1 and 2, a conventional decoder 10 is shown in which an LDPC codeword 12 is received from a memory structure such as, for example, NAND flash memory. In one example, the LDPC codeword 12 includes a set of data bits and a set of parity bits that are used to detect and correct errors in the data bits after transferring the data bits from one location to another (e.g., from a memory structure to a memory controller in a read operation). The LDPC codeword 12 is typically considered as being low density (e.g., sparse) because a parity-check matrix 16 that defines the LDPC codeword 12 contains few ones relative to the total size of the matrix 16. In general, a Tanner graph may represent the parity-check matrix 16 as check nodes corresponding to rows of the matrix 16 and variable nodes corresponding to columns of the matrix 16. Additionally, the LDPC codeword 12 may be monolithic in that while its parity-check matrix may contain columns or row with different degrees, it does not contain a spatial coupling structure as shown in a parity-check matrix 18. The monolithic LDPC codes may also be referred to as "uncoupled" codes.

By contrast, a spatially-coupled LDPC (SC-LDPC) codeword 14 is a variant of the LDPC codeword 12. A distinguishing feature between the LDPC codeword 12 and the SC-LDPC codeword 14 is the recursive structure in the SC-LDPC codeword 14. For example, to construct the parity-check matrix 18 of the SC-LDPC codeword 14, a base matrix H is split into three parts, namely, {H0, H1, H2}. These parts are arranged as shown in FIG. 2. The parity-check matrix 18 of the SC-LDPC codeword 14 has the property that the check nodes (e.g., rows) at the boundary have fewer connections, which facilitates the decoding of variable nodes (e.g., columns) at the boundary. This phenomenon may be referred to as a "wave propagation" effect of the spatial-coupling. In an embodiment, the information at the boundary propagates inward and results in a significant performance improvement over uncoupled codes. Indeed, the SC-LDPC codeword 14 may achieve capacity universally over all channels under the message-passing procedures such as sum-product message passing.

Accordingly, the illustrated SC-LDPC codeword 14 achieves significant RBER performance over the monolithic LDPC codeword 12 (e.g., a traditional LDPC code that includes both regular and irregular degrees). In fact, the SC-LDPC codeword 14 may achieve capacity under a belief-propagation (BP, e.g., sum-product message passing, which performs inferences on graphical models) decoder. Belief-propagation decoders, however, are challenging to implement due to hardware complexity (e.g., particularly for NVM systems that involve high throughput and low overall latency). Accordingly, the illustrated SC-LDPC codeword 14 is processed in hardware by a min-sum decoder 20.

Unlike sum-product message passing, a min-sum decoder generates an approximated message based on a minimum function of a check node. While the design of an effective min-sum decoder may have been well-studied for the monolithic LDPC codeword 12, this is not the case for the SC-LDPC codeword 14. As will be discussed in greater detail, the min-sum decoder 20 uses a plurality of scaling factors 22 to achieve a wave propagation of the decode operation (e.g., decoding variable nodes at the boundary). In an embodiment, the scaling factors are non-uniform across check nodes and across multiple iterations of the decode operation. Moreover, the scaling factors may be selected based on the performance of the decode operation, where the performance is determined based on a density evolution (DE) analysis. Accordingly, the illustrated decoder 20 achieves an improved RBER and greater memory capacity, while involving relatively low hardware complexity (e.g., reduced cost).

Figures 3A, 3B, 3C:
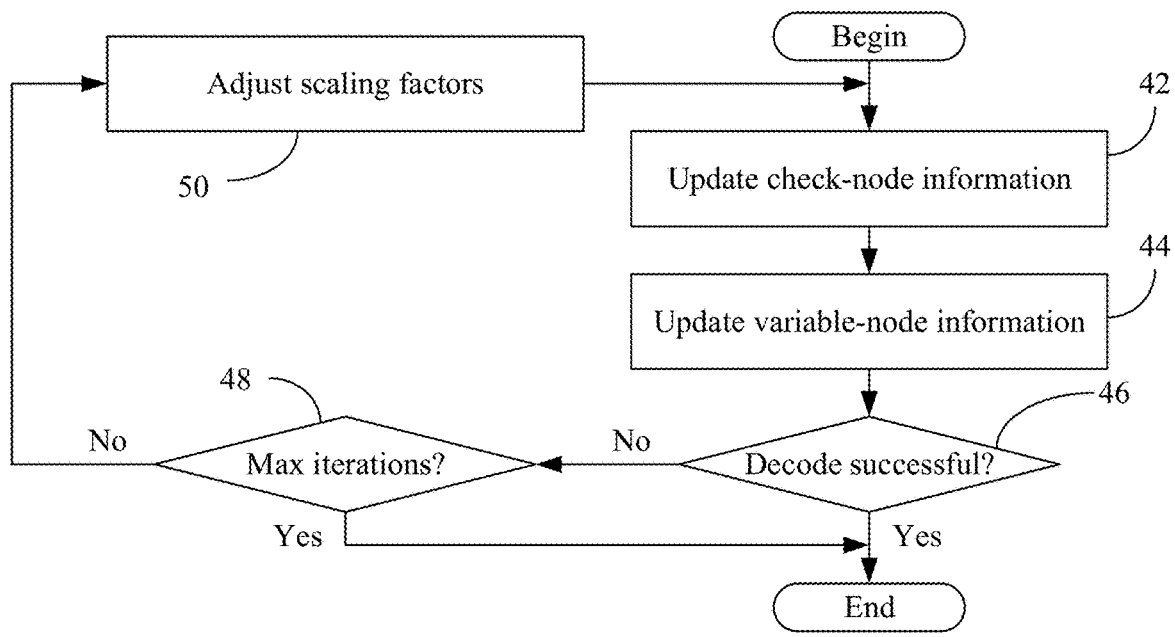
FIG. 3A is a flowchart of an example of a method of operating a decoder according to an embodiment.
FIG. 3B is a flowchart of an example of a method of conducting a min-sum decode according to an embodiment.
FIG. 3C is a flowchart of an example of a method of determining scaling factors according to an embodiment.

FIG. 3A shows a method 30 of operating a decoder. The method 30 may generally be implemented in a min-sum decoder such as, for example, the min-sum decoder 20 (FIG. 1), already discussed. More particularly, the method 30 may be implemented in one or more modules as a set of logic instructions stored in a machine- or computer-readable storage medium such as random access memory (RAM), ROM, programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 30 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 32 provides for receiving a codeword containing an SC-LDPC code. Block 34 conducts a min-sum decode of the SC-LDPC code based on a plurality of scaling factors. In one example, the scaling factors are non-uniform across check nodes and across multiple iterations of the min-sum decode. Moreover, the scaling factors may cause a wave propagation of the min-sum decode. In such a case, the min-sum decoder decodes variable nodes at a boundary of the SC-LDPC.

FIG. 3B shows a method 40 of conducting a min-sum decode. The method 40 may readily be substituted for block 34 (FIG. 3A), already discussed. More particularly, the method 40 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 42 updates check node information associated with an SC-LDPC codeword. Variable node information associated with the SC-LDPC may be updated at block 44. In an embodiment, a determination is made at block 46 as to whether the min-sum decode has been successful. If so, the illustrated method 40 terminates. If not, block 48 determines whether a maximum number of iterations has been reached. If so, the method 40 may terminate. In one example, if the maximum number of iterations has not been reached, block 50 adjusts scaling factors (e.g., "scales") of the min-sum decode and the method 40 returns to block 42. The scaling factors may be applied as a multiplicative scaling correction at the output of check nodes. For SC-LDPC codewords, varying the scaling factors over decoding iterations and keeping them synchronized with the wave-like decoding behavior (see, e.g., FIG. 4) seen in the SC-LDPC codes significantly enhances the min-sum decoder performance. In an embodiment, the scaling factors are provided externally and are programmable in real-time. Moreover, block 50 may alternatively be performed only in a subset of the total number of iterations. As will be discussed in greater detail, the scaling factors may be selected based on a density evolution analysis that quantifies the performance of the min-sum decode.

FIG. 3C shows a method 60 of determining scaling factors. The method 60 may readily be substituted for block 50 (FIG. 3B), already discussed. More particularly, the method 60 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS or TTL technology, or any combination thereof.

Illustrated processing block 62 provides for conducting a density evolution analysis to determine the performance of the min-sum decode, where the scaling factors are selected at block 64. The density evolution is a numerical procedure to analyze message-passing algorithms. Roughly speaking, for a given variable node and check node degree distribution, the density evolution analysis gives a value known as the threshold, which is essentially the "knee point" of the corresponding LDPC code (e.g., with the specified check node and variable node distribution). For a monolithic LDPC code in (see, e.g., FIG. 5), this knee point is roughly around 1.00E-2. Density evolution (DE) is used herein for SC-LDPC codewords.

While there may have been previous work on DE for belief-propagation decoders of SC-LDPC codewords, studies of DE for a min-sum decoder are lacking. In the use of DE for a min-sum decoder as described herein, the adjustment of scaling factors over decoding iterations is naturally incorporated. Thus, for each selection of the scale values over iterations, the threshold may be evaluated for the min-sum decoder with the corresponding scales. This threshold may again correspond to the knee point of the min-sum decoder performance with the corresponding scales. Thus, choosing the best scale values (e.g., to maximize the RBER correction strength) may be similar to choosing scale values that will optimize this knee point or the threshold from the density evolution. Performing the density evolution analysis to optimize the scaling factors over iterations for the min-sum decoder (either for the LDPC or SC-LDPC codes) provides advantages in terms of RBER, memory capacity and/or hardware complexity.

Figure 4:
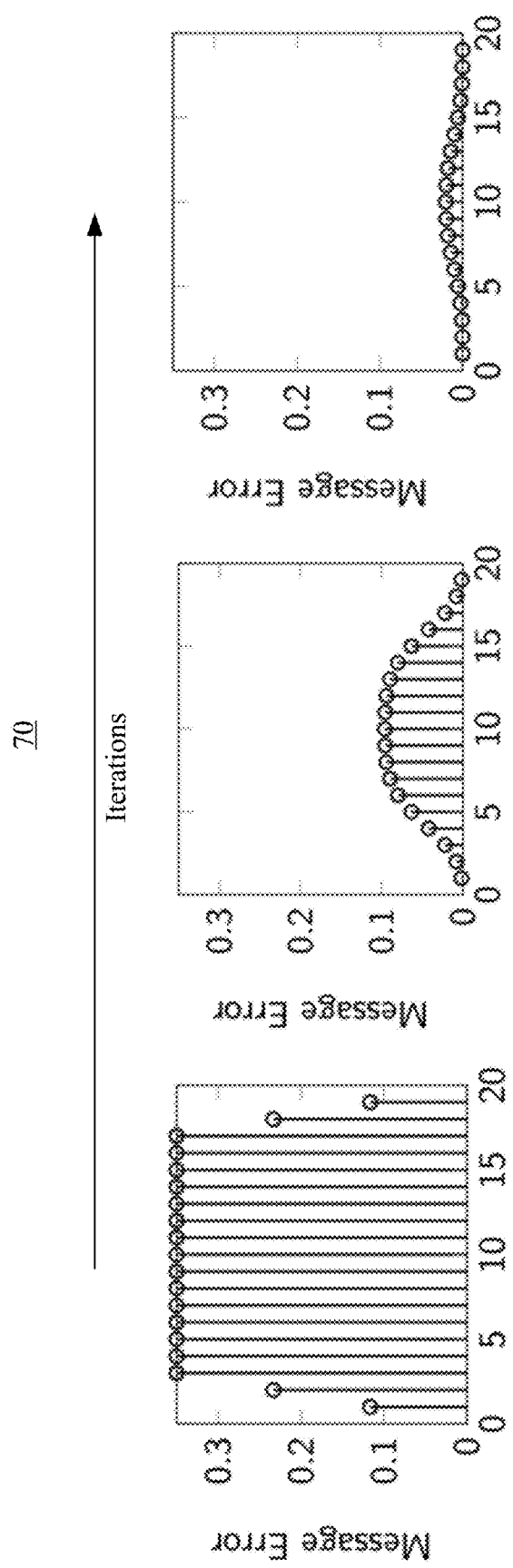
FIG. 4 is plot of an example of message errors across multiple iterations according to an embodiment.

Turning now to FIG. 4, a plot 70 of message errors across multiple decode iterations is shown, wherein the x-axis is the variable node group index and the boundary variable nodes are near indices zero and twenty. FIG. 4 generally demonstrates that the reason for the excellent performance of the SC-LDPC with a belief-propagation decoder is due to the wave-like decoding that starts from the boundary and propagates inward (see, e.g., FIG. 5). More particularly, the decoding of the bits starts from the boundary (e.g., columns C1, C4 in FIG. 2) and proceeds towards the middle section of the code (e.g., columns C2, C3 in FIG. 2). This behavior arises naturally with the belief-propagation decoder because the check nodes that have the least connections (e.g., R1, R6 in FIG. 2) provide the maximum information to correct the errors in columns C1 and C4. With decoding finished in columns C1 and C4, the check nodes R2 and R5 become active, and the decoding "wave" moves inward.

The crux of the illustrated solution lies in modifying the min-sum decoder to obtain the wave-like behavior. For example, at any given moment, the decoding occurs at the boundary of the wave. As such, in the min-sum decoder, large weights are assigned to the check nodes at the boundary of the wave in comparison to the check nodes further in the middle of the wave. Such an approach enables decoding of bits at the boundary and reduces the chances of incorrect flipping of the bits in the middle of the wave.

For SC-LDPC codes, the following enhancements may be made to the min-sum decoder: 1) a multiplicative scaling correction is applied at the output of check nodes; 2) the scaling factors at the check nodes are synced with the wave-like decoding in SC-LDPC codes, which can be achieved by varying the scales over iterations of decoding; and 3) the scale values are chosen by optimizing achievable thresholds from min-sum density evolution for SC-LDPC codes.

Figure 5:
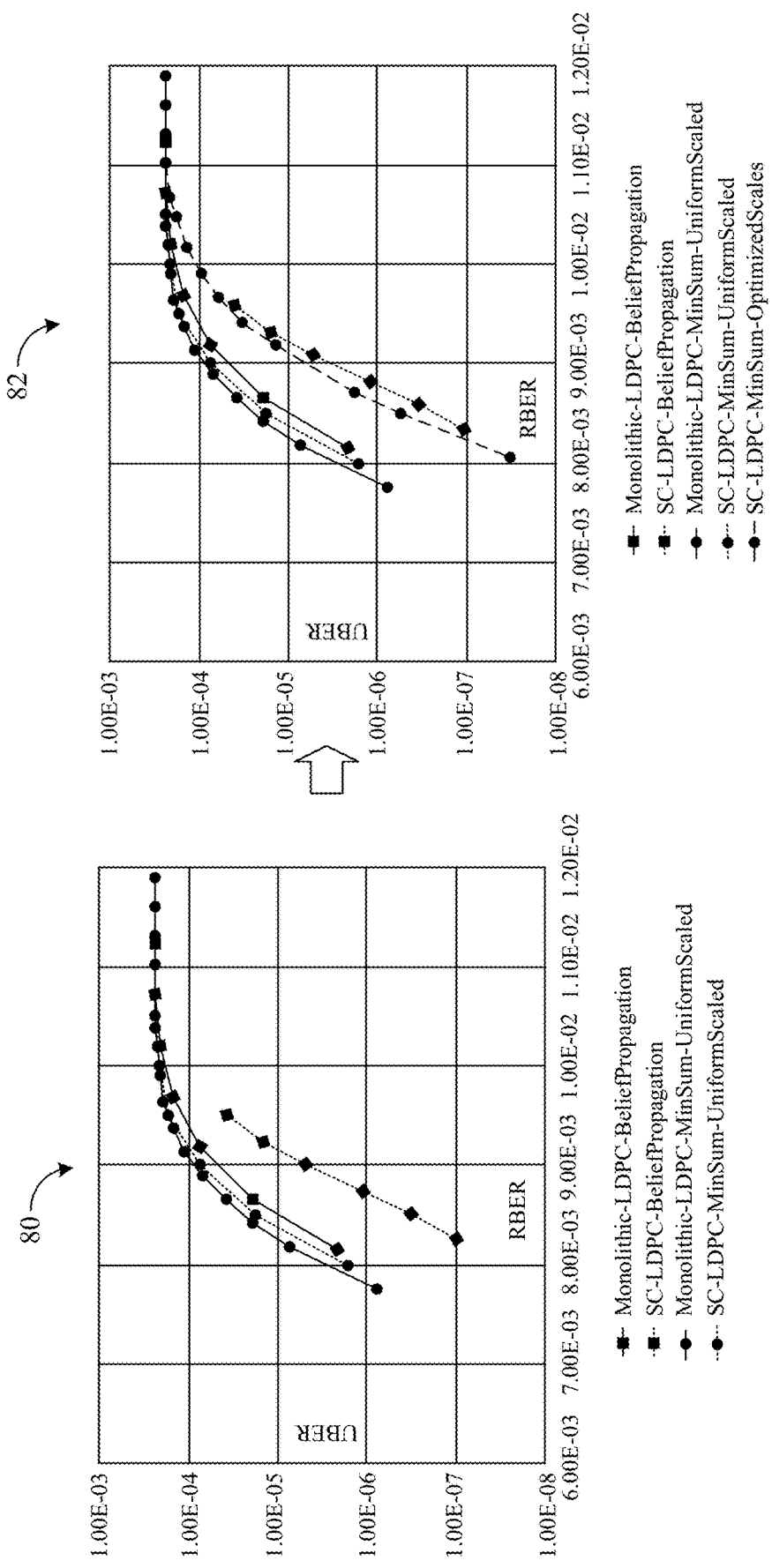
FIG. 5 is a plot of an example of a comparison between conventional bit error rates and bit error rates according to an embodiment.

FIG. 5 shows a conventional plot 80 of the RBER performance of an optimized monolithic LDPC code and an SC-LDPC code. The performance of the SC-LDPC code under the belief propagation decoder is much superior to that of the monolithic LDPC code. Under the min-sum decoder with uniform scaling of the messages, however, the same is not true. While the uniformly scaled min-sum decoder is very close to the performance of the belief-propagation decoder for monolithic codes, for SC-LDPC codes the uniformly scaled min-sum decoder performs significantly worse than the belief-propagation decoder. This result is disadvantageous because the gain for the SC-LDPC code under the belief-propagation might have been leveraged but the performance of the SC-LDPC code under the min-sum decoder is only slightly better than that of the monolithic code.

The technology described herein modifies the min-sum decoder for SC-LDPC codes so that the corresponding RBER performance comes close to the belief-propagation decoder. Such an approach enables the use of SC-LDPC codes to construct error-correction schemes with superior correctability. For example, an enhanced plot 82 demonstrates that after optimizing the min-sum decoder as described herein, significant improvement in performance is achieved. Indeed, the gap between the belief-propagation decoding performance and the optimized min-sum decoder is substantially reduced.

Figure 6:
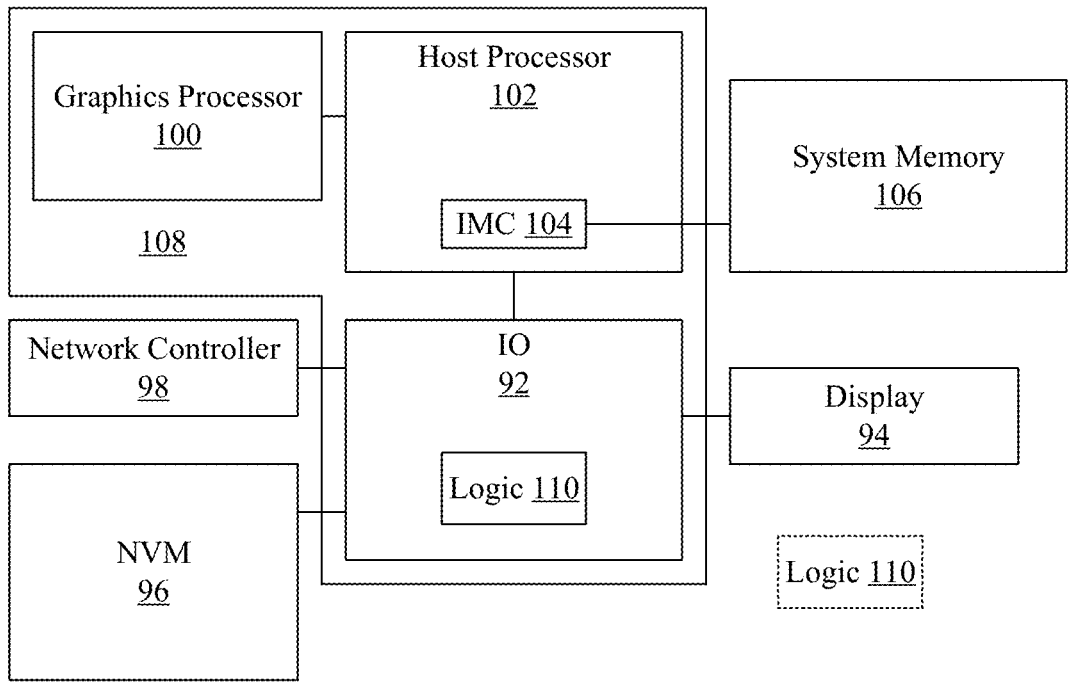
FIG. 6 is a block diagram of an example of a performance-enhanced computing system according to an embodiment.

FIG. 6 shows a performance-enhanced computing system 90. The system 90 may generally implement one or more aspects of the method 30 (FIG. 3A), the method 40 (FIG. 3B) and/or the method 60 (FIG. 3C), already discussed. More particularly, the system 90 may be part of a server, desktop computer, notebook computer, tablet computer, convertible tablet, smart television (TV), personal digital assistant (PDA), mobile Internet device (MID), smart phone, wearable device, media player, vehicle, robot, etc., or any combination thereof. In the illustrated example, an input/output (IO) module 92 is communicatively coupled to a display 94 (e.g., liquid crystal display/LCD, light emitting diode/LED display, touch screen), NVM 96 (e.g., NAND flash memory) and a network controller 98 (e.g., wired, wireless).

The system 90 may also include a graphics processor 100 and a host processor 102 (e.g., central processing unit/CPU) that includes an integrated memory controller (IMC) 104, wherein the illustrated IMC 104 communicates with a system memory 106 over a bus or other suitable communication interface. The host processor 102, the graphics processor 100 and the IO module 92 are integrated onto a shared semiconductor die 108 in a system on chip (SoC) architecture.

The illustrated IO module 92 includes logic 110 (e.g., memory controller and/or decoder including logic instructions, configurable logic, fixed-functionality hardware logic, etc., or any combination thereof) to implement one or more aspects of the method 30 (FIG. 3A), the method 40 (FIG. 3B) and/or the method 60 (FIG. 3C), already discussed. Thus, the logic 110 may receive a codeword containing an SC-LDPC code, wherein the codeword is received from the NVM 96 or other memory structure. The logic 110 may also conduct a min-sum decode of the SC-LDPC code based on a plurality of scaling factors. In an embodiment, the scaling factors are non-uniform across check nodes and multiple iterations of the min-sum decode. In one example, the scaling factors cause a wave propagation of the min-sum decode. Although the logic 110 is shown in the IO module 92, the logic 110 may reside elsewhere in the system 90. The illustrated system 90 may be considered to be performance-enhanced to the extent that it achieves an improved RBER and greater memory capacity, while being involving relatively low hardware complexity (e.g., reduced cost).

In an embodiment, the NVM 96 is mass storage containing a memory structure that may include non-volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

Figure 7:
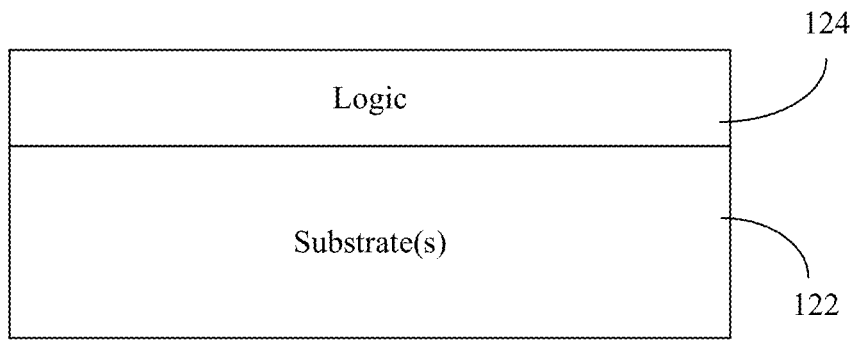
FIG. 7 is an illustration of an example of a semiconductor package apparatus according to an embodiment.

FIG. 7 shows a semiconductor apparatus 120 (e.g., chip, die) that includes one or more substrates 122 (e.g., silicon, sapphire, gallium arsenide) and logic 124 (e.g., transistor array and other integrated circuit/IC components) coupled to the substrate(s) 122. The logic 124, which may be implemented at least partly in configurable logic and/or fixed-functionality hardware logic, may generally implement one or more aspects of the method 30 (FIG. 3A), the method 40 (FIG. 3B) and/or the method 60 (FIG. 3C), already discussed. Thus, the logic 124 may receive a codeword containing an SC-LDPC code and conduct a min-sum decode of the SC-LDPC code based on a plurality of scaling factors. In an embodiment, the scaling factors are non-uniform across check nodes and multiple iterations of the min-sum decode. In one example, the scaling factors cause a wave propagation of the min-sum decode. The illustrated apparatus 120 may be considered to be performance-enhanced to the extent that it achieves an improved RBER and greater memory capacity, while being involving relatively low hardware complexity (e.g., reduced cost).

In one example, the logic 124 includes transistor channel regions that are positioned (e.g., embedded) within the substrate(s) 122. Thus, the interface between the logic 124 and the substrate(s) 122 may not be an abrupt junction. The logic 124 may also be considered to include an epitaxial layer that is grown on an initial wafer of the substrate(s) 122.

Additional Notes and Examples

Example 1 includes a semiconductor apparatus comprising one or more substrates and logic coupled to the one or more substrates, wherein the logic is at least partly implemented in one or more of configurable or fixed-functionality hardware, and the logic is to receive a codeword containing a spatially-coupled low-density parity-check (SC-LDPC) code and conduct a min-sum decode of the SC-LDPC code based on a plurality of scaling factors.

Example 2 includes the semiconductor apparatus of Example 1, wherein the scaling factors are to be non-uniform across check nodes and across multiple iterations of the min-sum decode.

Example 3 includes the semiconductor apparatus of Example 1, wherein the scaling factors are to cause a wave propagation of the min-sum decode.

Example 4 includes the semiconductor apparatus of Example 3, wherein the min-sum decode is to decode variable nodes at a boundary of the SC-LDPC.

Example 5 includes the semiconductor apparatus of Example 1, wherein the logic coupled to the one or more substrates is to select the scaling factors based on a performance of the min-sum decode.

Example 6 includes the semiconductor apparatus of Example 5, wherein the logic coupled to the one or more substrates is to conduct a density evolution analysis to determine the performance of the min-sum decode.

Example 7 includes the semiconductor apparatus of any one of Examples 1 to 6, wherein the codeword is to be received from a NAND memory structure.

Example 8 includes a performance-enhanced computing system comprising a memory structure, and a memory controller coupled to the memory structure, wherein the memory controller includes logic coupled to one or more substrates to receive a codeword containing a spatially-coupled low-density parity-check (SC-LDPC) code, wherein the codeword is received from the memory structure, and conduct a min-sum decode of the SC-LDPC code based on a plurality of scaling factors.

Example 9 includes the system of Example 8, wherein the scaling factors are to be non-uniform across check nodes and multiple iterations of the min-sum decode.

Example 10 includes the system of Example 8, wherein the scaling factors are to cause a wave propagation of the min-sum decode.

Example 11 includes the system of Example 10, wherein the min-sum decode is to decode variable nodes at a boundary of the SC-LDPC.

Example 12 includes the system of Example 8, wherein the logic coupled to the one or more substrates is to select the scaling factors based on a performance of the min-sum decode.

Example 13 includes the system of Example 12, wherein the logic coupled to the one or more substrates is to conduct a density evolution analysis to determine the performance of the min-sum decode.

Example 14 includes the system of any one of Examples 8 to 13, wherein the memory structure is a NAND memory structure.

Example 15 includes a method comprising receiving a codeword containing a spatially-coupled low-density parity-check (SC-LDPC) code and conducting a min-sum decode of the SC-LDPC code based on a plurality of scaling factors.

Example 16 includes the method of Example 15, wherein the scaling factors are non-uniform across check nodes and across multiple iterations of the min-sum decode.

Example 17 includes the method of Example 15, wherein the scaling factors cause a wave propagation of the min-sum decode.

Example 18 includes the method of Example 17, wherein the min-sum decode decodes variable nodes at a boundary of the SC-LDPC.

Example 19 includes the method of any one of Examples 15 to 18, further including selecting the scaling factors based on a performance of the min-sum decode.

Example 20 includes the method of Example 19, further including conducting a density evolution analysis to determine the performance of the min-sum decode.

Example 21 includes means for performing the method of any one of Examples 15 to 20.

Technology described herein may therefore provide a substantial enhancement to min-sum decoders for SC-LDPC codes. The technology enables the use of the spatial-coupling phenomenon to design better error correction schemes for memory structures such as 3D-NAND memory systems. Accordingly, significant savings may be achieved in terms of the improved yield and faster delivery of the product to the market.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/ or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A semiconductor apparatus comprising:
one or more substrates; and
logic coupled to the one or more substrates, wherein the logic is at least partly implemented in one or more of configurable or fixed-functionality hardware, and the logic is to:
receive a codeword containing a spatially-coupled low-density parity-check (SC-LDPC) code; and
conduct a min-sum decode of the SC-LDPC code based on a plurality of scaling factors, wherein the scaling factors are to be non-uniform across multiple iterations of the min-sum decode so that the plurality of scaling factors are adjusted in response to a determination that a maximum number of iterations has not been reached, and wherein variation of the scaling factors to be non-uniform across the multiple iterations is performed while also keeping the scaling factors non-uniform across a plurality of check nodes so as to maintain a synchronization with a wave-shape associated with the SC-LDPC code across the multiple iterations.

2. The semiconductor apparatus of claim 1, wherein the scaling factors are to cause a wave propagation of the min-sum decode.

3. The semiconductor apparatus of claim 2, wherein the min-sum decode is to decode variable nodes at a boundary of the SC-LDPC.

4. The semiconductor apparatus of claim 1, wherein the logic coupled to the one or more substrates is to select the scaling factors based on a performance of the min-sum decode.

5. The semiconductor apparatus of claim 4, wherein the logic coupled to the one or more substrates is to conduct a density evolution analysis to determine the performance of the min-sum decode.

6. The semiconductor apparatus of claim 1, wherein the codeword is to be received from a NAND memory structure.

7. A system comprising:
a memory structure; and
a memory controller coupled to the memory structure, wherein the memory controller includes logic coupled to one or more substrates to:
receive a codeword containing a spatially-coupled low-density parity-check (SC-LDPC) code, wherein the codeword is received from the memory structure; and
conduct a min-sum decode of the SC-LDPC code based on a plurality of scaling factors, wherein the scaling factors are to be non-uniform across multiple iterations of the min-sum decode so that the plurality of scaling factors are adjusted in response to a determination that a maximum number of iterations has not been reached, and wherein variation of the scaling factors to be non-uniform across the multiple iterations is performed while also keeping the scaling factors non-uniform across a plurality of check nodes so as to maintain a synchronization with a wave-shape associated with the SC-LDPC code across the multiple iterations.

8. The system of claim 7, wherein the scaling factors are to cause a wave propagation of the min-sum decode.

9. The system of claim 8, wherein the min-sum decode is to decode variable nodes at a boundary of the SC-LDPC.

10. The system of claim 7, wherein the logic coupled to the one or more substrates is to select the scaling factors based on a performance of the min-sum decode.

11. The system of claim 10, wherein the logic coupled to the one or more substrates is to conduct a density evolution analysis to determine the performance of the min-sum decode.

12. The system of claim 7, wherein the memory structure is a NAND memory structure.

13. A method comprising:
   receiving a codeword containing a spatially-coupled low-density parity-check (SC-LDPC) code; and
   conducting a min-sum decode of the SC-LDPC code based on a plurality of scaling factors, wherein the scaling factors are to be non-uniform across multiple iterations of the min-sum decode so that the plurality of scaling factors are adjusted in response to a determination that a maximum number of iterations has not been reached, and wherein varying the scaling factors to be non-uniform across the multiple iterations is performed while also keeping the scaling factors non-uniform across a plurality of check nodes so as to maintain a synchronization with a wave-shape associated with the SC-LDPC code across the multiple iterations.

14. The method of claim 13, wherein the scaling factors cause a wave propagation of the min-sum decode.

15. The method of claim 14, wherein the min-sum decode decodes variable nodes at a boundary of the SC-LDPC.

16. The method of claim 13, further including selecting the scaling factors based on a performance of the min-sum decode.

17. The method of claim 16, further including conducting a density evolution analysis to determine the performance of the min-sum decode.

\* \* \* \* \*